(12) United States Patent
Kim et al.

(10) Patent No.: US 10,143,093 B2
(45) Date of Patent: Nov. 27, 2018

(54) MODULAR APPARATUS FOR HIGH VOLTAGE DIRECT-CURRENT TRANSMISSION SYSTEM

(71) Applicant: HYOSUNG HEAVY INDUSTRIES CORPORATION, Seoul (KR)

(72) Inventors: June-Sung Kim, Anyang-si (KR); Hong-Ju Jung, Seoul (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 78 days.

(21) Appl. No.: 15/103,453

(22) PCT Filed: Dec. 24, 2014

(86) PCT No.: PCT/KR2014/012855
§ 371 (c)(1),
(2) Date: Jun. 10, 2016

(87) PCT Pub. No.: WO2015/099466
PCT Pub. Date: Jul. 2, 2015

(65) Prior Publication Data
US 2016/0295712 A1    Oct. 6, 2016

(30) Foreign Application Priority Data
Dec. 26, 2013  (KR) .................. 10-2013-0163717

(51) Int. Cl.
*H05K 5/00*    (2006.01)
*H02M 1/00*    (2006.01)
(Continued)

(52) U.S. Cl.
CPC ............. *H05K 5/0017* (2013.01); *H02J 3/36* (2013.01); *H02M 1/00* (2013.01); *H05K 5/0247* (2013.01);
(Continued)

(58) Field of Classification Search
CPC .. H05K 5/0017; H05K 5/0247; H05K 7/1427; H05K 7/1432; H02J 3/36
See application file for complete search history.

(56) References Cited

U.S. PATENT DOCUMENTS

| 4,084,250 A | * | 4/1978 | Albertine | ............... | H05K 1/144 |
| | | | | | 361/679.48 |
| 4,692,778 A | * | 9/1987 | Yoshimura | ............... | B41J 29/12 |
| | | | | | 346/145 |

(Continued)

FOREIGN PATENT DOCUMENTS

| CN | 103036452 A | 4/2013 |
| JP | 58-145195 A | 8/1983 |

(Continued)

*Primary Examiner* — Hoa C Nguyen
*Assistant Examiner* — Christopher L Augustin
(74) *Attorney, Agent, or Firm* — Novick, Kim & Lee, PLLC; Jae Youn Kim

(57) ABSTRACT

The present invention relates to a modular apparatus for a high-voltage direct-current transmission system. A sub-module (10), which is a modular apparatus, comprises according to the present invention a power unit (12) in the front and a capacitor unit (13) in the rear, and on the lower end of a front surface (14') of a power unit housing (14) forming the exterior of the power unit (12) is a sloped surface (15). The sloped surface (15) has a hexahederal shape created by removing the edge formed by the front surface (14') and the bottom surface of the power unit housing (14) and faces the ground at an angle. A display unit (16) is provided on the sloped surface (15) so that the status of the sub-module (10) can be easily checked by a worker from the ground on which a structure stands. A front panel (18) comprising the display unit (16) is provided on the sloped surface (15), wherein the front panel (18) is provided with a panel through-hole (18') to allow a configuration space (20) in the interior to be visible. A control board (22) is coupled to the front panel (Continued)

(18) by means of a connection block (23). The control board (22) is movably supported on either end thereof by support rails (26) provided on both inner side walls of the configuration space (20) so as to allow easy entry into the interior and exit to the outside of the power unit (12).

16 Claims, 7 Drawing Sheets

(51) Int. Cl.
*H02J 3/36* (2006.01)
*H05K 5/02* (2006.01)
*H05K 7/14* (2006.01)

(52) U.S. Cl.
CPC ......... *H05K 7/1427* (2013.01); *H05K 7/1432* (2013.01); *Y02E 60/60* (2013.01)

(56) References Cited

U.S. PATENT DOCUMENTS

| | | | | |
|---|---|---|---|---|
| 4,821,150 A * | 4/1989 | Duthie | ................ | H05K 7/1461 361/736 |
| 5,870,245 A * | 2/1999 | Kersey | ................ | G11B 15/6835 360/92.1 |
| 6,041,956 A * | 3/2000 | Kao | ................ | H05K 5/04 220/4.02 |
| 6,144,549 A * | 11/2000 | Moss | ................ | G06F 1/181 312/223.1 |
| 7,019,230 B1 * | 3/2006 | Vaill | ................ | H02B 3/00 200/50.21 |
| 9,078,348 B1 * | 7/2015 | Grandin | ................ | H05K 7/02 |
| 2002/0084089 A1 * | 7/2002 | Holt | ................ | H02B 1/308 174/50 |
| 2004/0106331 A1 * | 6/2004 | Hoegener | ................ | H05K 5/0017 439/701 |
| 2005/0189889 A1 * | 9/2005 | Wirtz | ................ | H02M 7/003 318/105 |
| 2008/0180888 A1 * | 7/2008 | Koutari | ................ | G01C 21/265 361/679.01 |
| 2008/0204500 A1 * | 8/2008 | Umeda | ................ | B41J 2/175 347/17 |
| 2008/0291624 A1 * | 11/2008 | Karstens | ................ | H05K 5/0017 361/690 |
| 2011/0133560 A1 * | 6/2011 | Yamashita | ................ | G06F 1/30 307/66 |
| 2013/0322016 A1 | 12/2013 | Jones et al. | | |
| 2014/0084837 A1 * | 3/2014 | Tio | ................ | H02P 6/14 318/519 |
| 2014/0239007 A1 * | 8/2014 | McBride | ................ | G07F 19/203 221/1 |

FOREIGN PATENT DOCUMENTS

| | | |
|---|---|---|
| KR | 10-1018863 B1 | 3/2011 |
| KR | 10-2011-0096713 A | 8/2011 |
| KR | 10-1288679 B1 | 7/2013 |
| WO | 2012-020496 A1 | 2/2012 |

* cited by examiner

MODULAR APPARATUS FOR HIGH VOLTAGE DIRECT-CURRENT TRANSMISSION SYSTEM

TECHNICAL FIELD

The present invention relates to a modular apparatus for a high-voltage direct-current transmission system and, more particularly, to a modular apparatus for a high-voltage direct-current transmission system that allows for checking a modular apparatus, which is installed at a high position from the ground.

BACKGROUND ART

A HVDC (High Voltage Direct Current) system supplies power by converting AC power from a power plant into DC power, transmitting the DC power, and then inverting the DC power into AC power at a power receiving point. The HVDC system has a loss of power less than an AC transmission type, sot it has high power transmission efficiency. Further, the system can improve stability through line separation and has small inductive disturbance, so it is advantageous in long-distance power transmission.

The HVDC system is installed in a structure called a converter module composed of a plurality of submodules stacked 10 meters high in a plurality of layers. Accordingly, two ways are largely used to check the states of the submodules. One of the ways is to use a monitoring computer in a control room at a remote place. The other one is to stop the system and manually check the states of the modules at the site.

However, since the submodules are installed in a high structure, a worker has to use tools such as an aerial ladder, so it is difficult to check the states and maintain the control board.

DISCLOSURE

Technical Problem

An object of the present invention is to allow a worker to visually check the state of a module for a high-voltage direct-current transmission system around a structure on the ground.

Another object of the present invention is to make it possible to easily maintain a control board of a module in a high-voltage direct-current transmission system.

Another object of the present invention is to more stably connect a control board of a module in a high-voltage direct-current transmission system to the outside by installing the control board in a specific space in the module.

Technical Solution

According to an aspect of the present invention, there is provided a modular apparatus for a high-voltage direct-current transmission system, the apparatus including: a housing forming an external shape; a display unit on an inclined surface formed at a front lower portion of the housing at an angle to the ground; and a control board disposed in an installation space at a lower portion in the housing and controlling components in response to control signals transmitted through a cable.

The display unit may show states of components and may be connected with a cable for connection with a controller.

The installation space may be separated by a separation plate in a space corresponding to an inner side of inclined surface.

A front panel may be disposed on a front of the display unit at a position of an open hole and a panel hole may be formed through the front panel so that the inside of the installation space is seen from the outside.

The front panel may be coupled to the control board through a coupling block and the coupling block may have a flat side where the control board is coupled and an inclined side having predetermined inclination to couple the front panel.

Lamps for showing states of components in the module may be disposed at a front end of the control board so that the states can be checked through the panel hole from the outside.

A connector for connection with the cable may be disposed at the front end of the control board.

Both ends of the control board may be moved along guide channels of support rails disposed at both sides in the installation space.

The housing may be a first part of the modular apparatus and a second part may be separably combined with the first part.

The first part may be a power unit and the second part may be a capacitor unit.

Advantageous Effects

It is possible to achieve the following effects from the modular apparatus for a high-voltage direct-current transmission system according to the present invention.

According to the present invention, the inclined surface is formed at the front lower end of the power unit and the display unit is on the inclined surface so that a worker can easily visually check the state of the module. Accordingly, a worker can easily check the state of the module located at a high position from the ground.

Further, since the control board connected to the display unit is disposed in a specific space in the housing of the module, influence by the surroundings is minimized. In addition, since the control board can be moved into and out of the module along the support rails, it is possible to relatively easily maintain the control board.

Further, a optical cable is used to connect the control board and a controller at the outside and optical cable is connected to the control board inside further than the front of the housing of the module, so the optical cable does not protrude further than the front of the module, and accordingly, movement of the optical cable due to external force is prevented and a more stable signal connection between the module and the outside can be more stably ensured.

MODE FOR INVENTION

Figure 1:
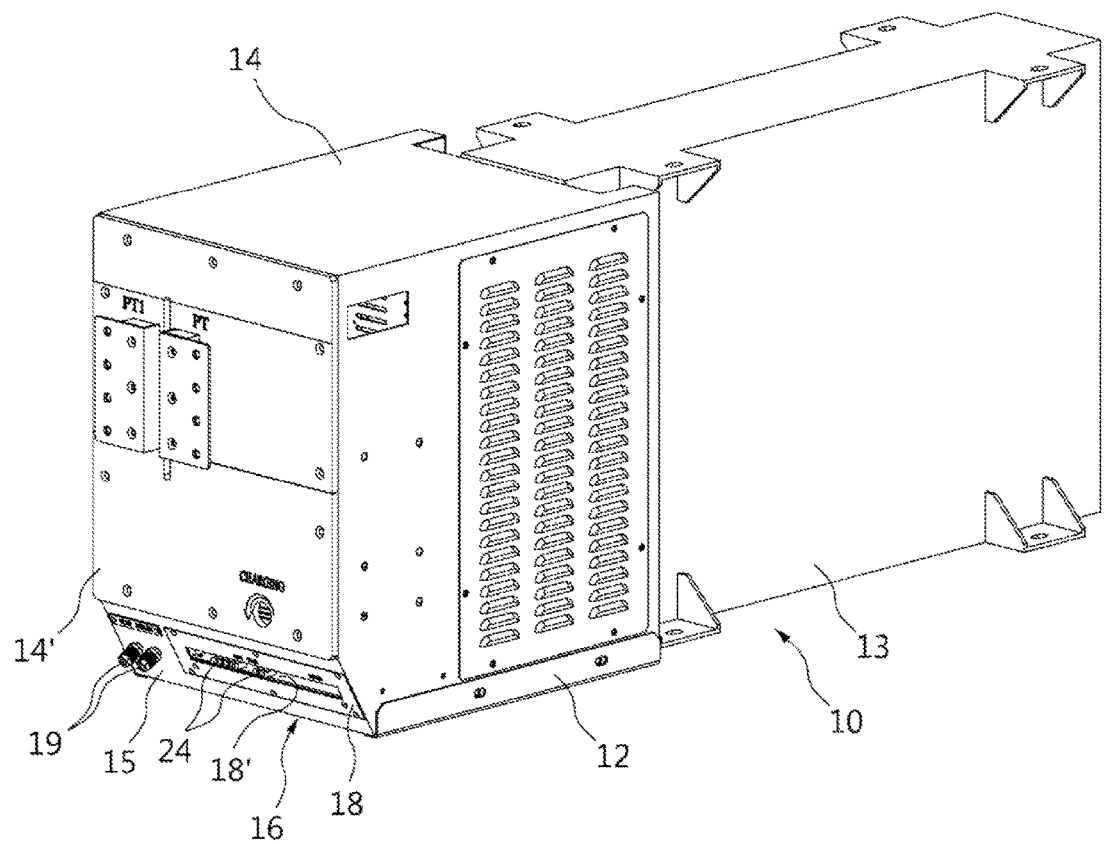
FIG. 1 is a perspective view showing the configuration of an embodiment of a modular apparatus for a high-voltage direct-current transmission system according to the present invention.
Figure 2:
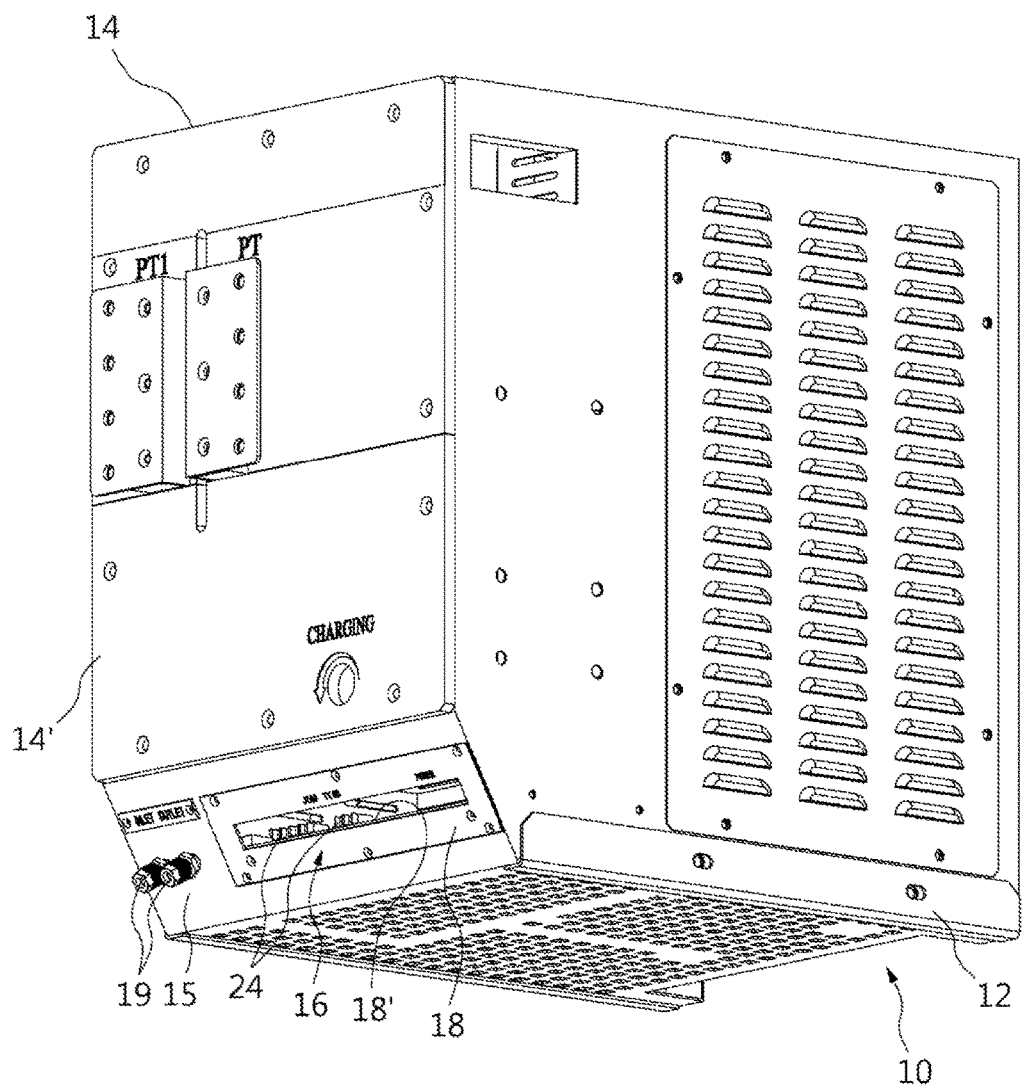
FIG. 2 is a perspective view showing a main configuration of an embodiment of the present invention seen from the front lower portion.

An embodiment of a modular apparatus for a high-voltage direct-current transmission system according to the present invention is described hereafter in detail with reference to the accompanying drawings. A submodule of modules for a high-voltage direct-current transmission system is exemplified herein.

As shown in the figures, a submodule 10 that is a modular apparatus of the present invention is largely composed of a power unit 12 and a capacitor unit 13. Various power semiconductors and various boards are in the power unit 12. A power unit housing 14 forms the external shape of the power unit 12. In this embodiment, the power unit housing 14 has a substantially hexahedral shape. The front 14' of the power unit housing 14 is a flat surface with an inclined surface 15 at the lower end. The inclined surface 15 is formed by cutting off the edge between the front 14' and the bottom of the power unit housing 14.

A display unit 16 is on the inclined surface 15. The display unit 16 shows the state of the submodule 10. Obviously, signals are connected between the submodule 10 and a controller (not shown) through the display unit 16.

A front panel 18 forms the external shape of the display unit 16. The front panel 18 is disposed in an open hole (not given a reference numeral) formed on the inclined surface 15. The front panel 18 is a rectangular plate. However, the front panel 18 may be formed in various shapes. A panel hole 18' may be formed through the front panel 18. The panel hole 18' is formed in a rectangular shape in this embodiment. Obviously, the front hole 18' may also be formed in various shapes. The panel hole 18' is open in this embodiment, but it may be closed by a transparent member. Reference numeral '19' indicates couplers for connecting cooling hoses.

Figure 3:
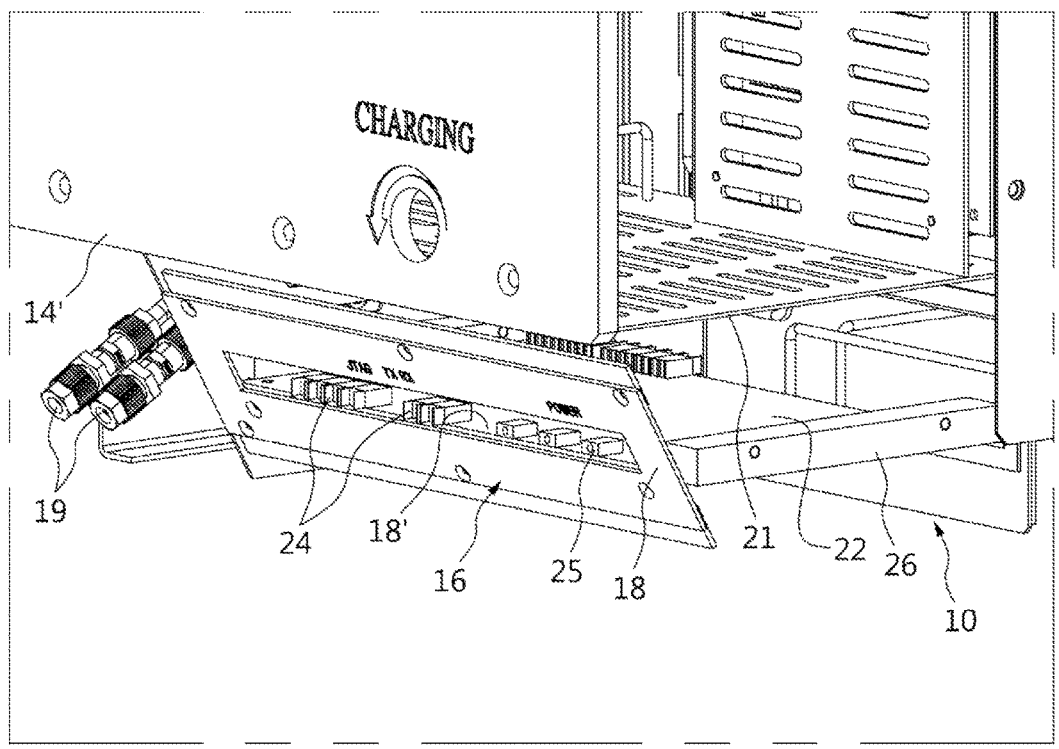
FIG. 3 is a perspective view showing an internal configuration of an embodiment of the present invention.
Figure 4:
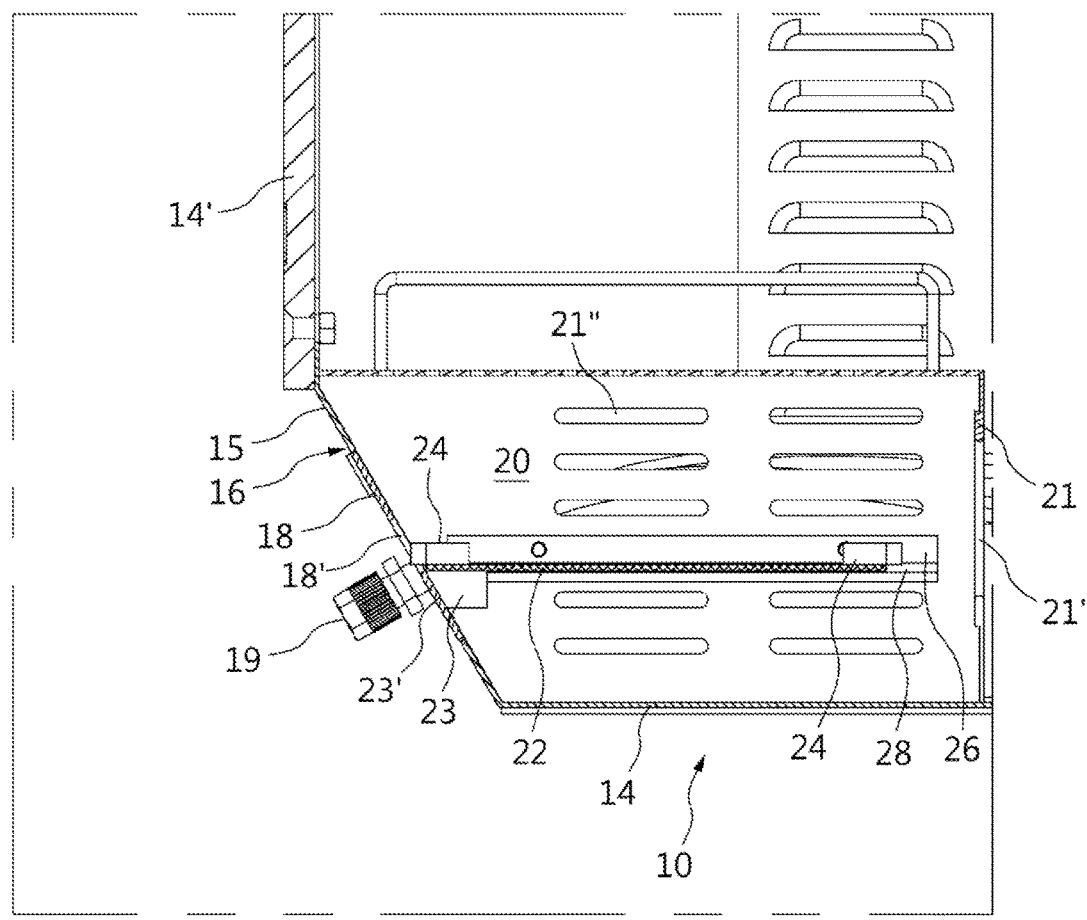
FIG. 4 is a partial cross-sectional view showing a main configuration of an embodiment of the present invention.
Figure 5:
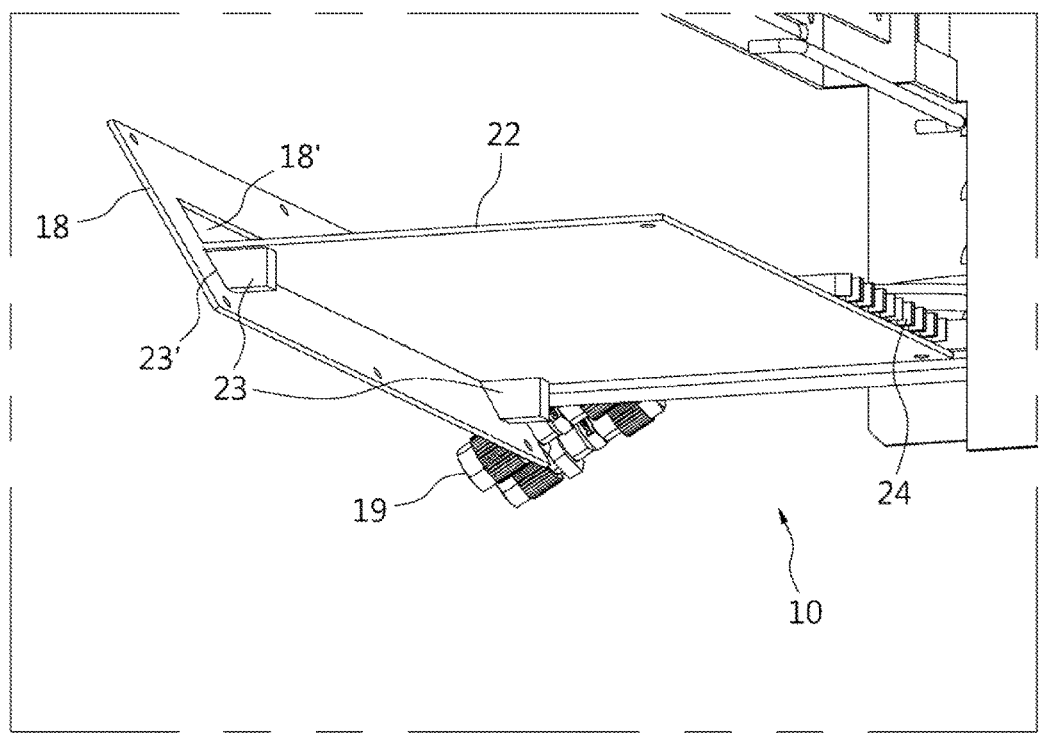
FIG. 5 is a perspective view showing the configuration of a front panel and a control board of an embodiment of the present invention.

As shown in FIGS. 3 and 4, an installation space 20 is defined in the power unit housing 14. The installation space 20 is separately defined in the power unit housing 14.

The installation space 20 is positioned at the lower front portion of the submodule 10, more accurately, the power unit 12. As the installation space 20 is positioned at the lower front portion of the power unit 12, it is possible to minimize the length of an optical cable 30 for signal connection between the submodule 10 and the controller. As the length of the optical cable 30 is minimized, the possibility of external force being applied to the optical cable 30 is reduced.

A separation plate 21 is disposed in the power unit housing 14 to define the installation space 20. The separation plate 21 defines the installation space 20 in cooperation with the power unit housing 14. The separation plate 21 forms at least three or four sides for defining the installation space 20.

A connection hole 21' that connects the internal space of the power unit housing 14 and the installation space 20 is formed in a predetermined size through the separation plate 21. A cable for electric signal connection between the control board 22 to be described below and the components in the internal space of the power housing unit 12 is disposed through the connection hole 21'.

A plurality of through-holes 21" for airflow between the installation space 20 and the power unit housing 14 is formed through the separation plate 21. The through-holes 21" are relatively larger than the connection hole 21'. The through holes 21" are formed at the sides formed by the separation plate 21.

The control board 22 is disposed in the installation space 20. The control board 22 is provided to control the submodule 10. Various components are mounted on the control board 22, but most of them are not shown in the figures.

The control board 22 is coupled to the front panel 18 through a coupling block 23. The coupling block 23 has a hexahedral shape and of which a side is coupled to the control board 22 and another side that is an inclined side 23' is coupled to the front panel 18. As described above, since the inclined side 23' is coupled to the front panel 18, the front panel 18 has a predetermined angle with respect to the control board 22. The control board 22 and the front panel 18 are combined by the coupling block 23 and can be put into or taken out of the power unit housing 14.

Figure 6:
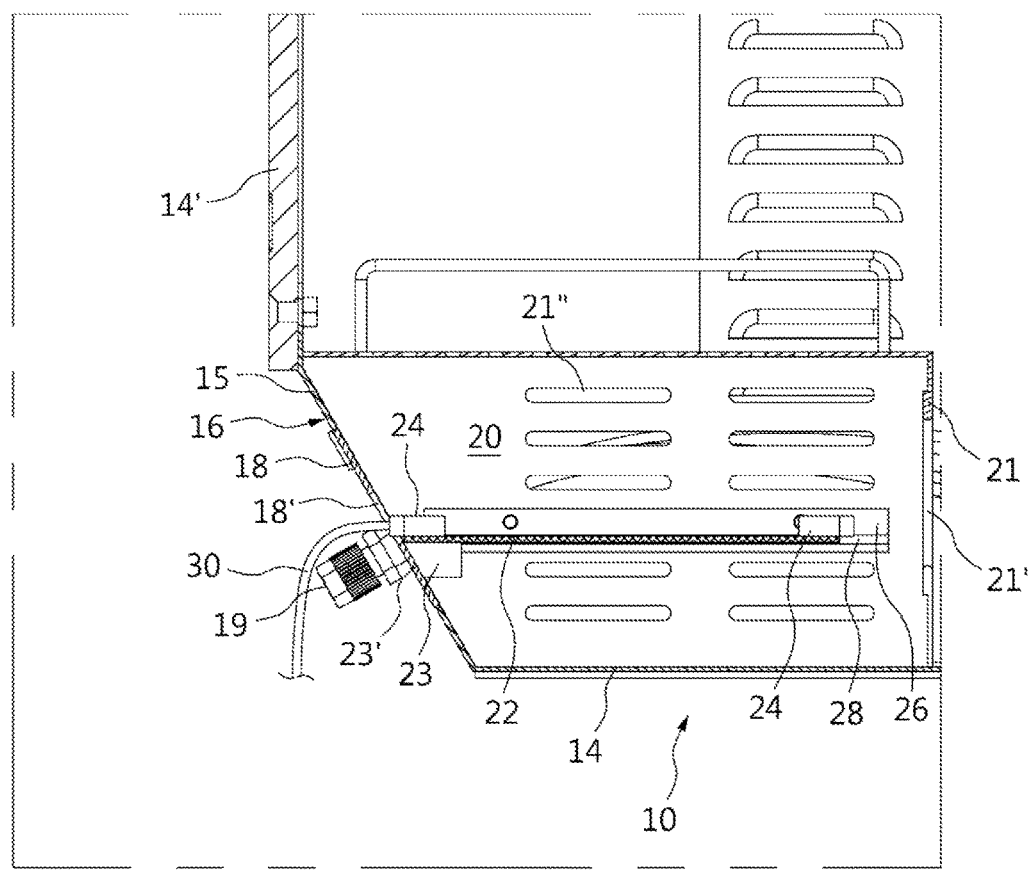
FIG. 6 is a view showing an optical cable connected to a connector of a control board in an embodiment of the present invention.

Connectors 24 are disposed on the control board 22. The connectors 24 are provided for signal connection between the control board 22 and the outside. In the connectors 24, the connectors 24 at the front end of the control board 22 are connected with an optical cable 30 (see FIG. 6) for signal connection between the submodule 10 and the controller, while the connectors 24 at the rear end of the control board 22 are provided for signal connection between the control board 22 and other components in the submodule 10.

A plurality of lamps 25 may be disposed at the front end of the control board 22. The lamps 25 are arranged in parallel and can show the state of the submodule by turning on/off. For example, it is possible to turn on a specific one of the lamps 25 to show that a specific component is in a normal state and to turn off the specific one to show that the specific component is in an abnormal state.

Figure 7:
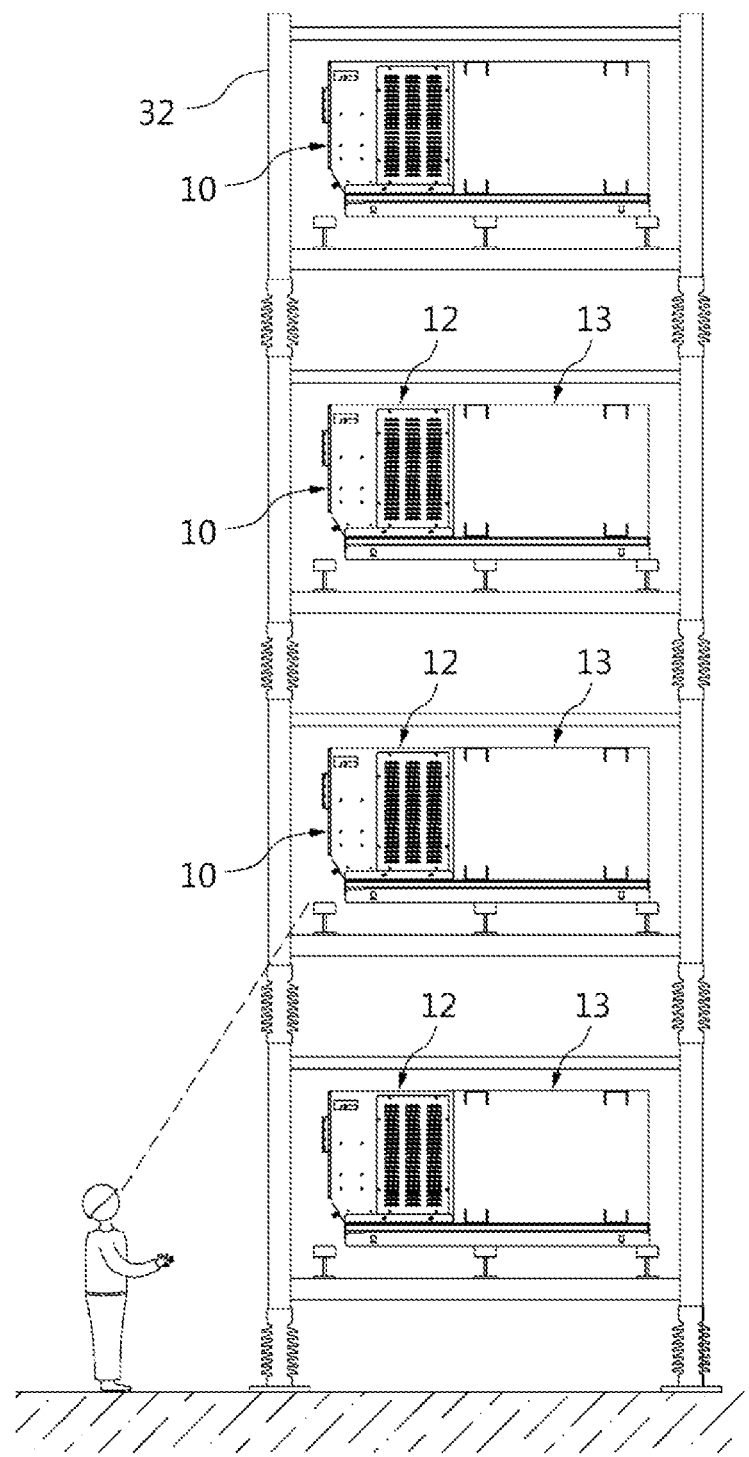
FIG. 7 is a view showing a worker visually checking a display unit of a modular apparatus in an embodiment of the present invention.

The submodule 10 according to an embodiment of the present invention is installed in a high-rise structure 32, as shown in FIG. 7. The structure 32 is about 10 m high and has a plurality of floors, and the submodule 10 is installed on each floor. The submodule 10 is installed and used on each floor of the structure 32.

Use of the modular apparatus for a high-voltage direct-current transmission system according to the present invention having the configuration described above is described in detail hereafter.

The submodule 10 is installed and used on each floor of the structure 32, as shown in FIG. 7. The power units 12 of the submodules 10 are connected to a controller on the ground where the structure 32 is constructed through cables 30. Control signals from the controller are transmitted to the control boards 22 in the power units 12 of the submodules 10 through the cables 30.

The control signals transmitted to the control board 22 are transmitted to the components in the power units 120, thereby operating the submodules 10. The operational states of the submodules 10 or the operational states of the components in the submodules 10 are shown by the lamps 25. It is possible to check the operational states of the submodules 10 in a monitoring room at a remote place, but a worker at the site can check the operational states by looking up at the structure 32 from the ground, as shown in FIG. 7.

In particular, since the inclined surface 15 is formed at the lower portion of the front 14' of each submodule 10 and the display unit 16 is on the inclined surface 15 in the present invention, a worker can easily check the display units 16. This is because the inclined surfaces 15 are inclined with respect to the ground and accordingly a worker can look up and check the display units 16 on the inclined surfaces 15.

Further, the optical cables 30 are connected to the connectors 24 of the control board 22 through the panel holes 18' of the front panels 18 that form the external shapes of the display units 16. Accordingly, the optical cables 30 do not protrude further than the fronts 14' of the submodules 10 due to the portions removed to form the inclined surfaces 15.

Further, since the control boards 22 are disposed at the lower portion of the power unit housings 14 forming the external shapes of the submodules 10 (in detail, the power units 12), the lengths of the optical cable 30 are relatively reduced. Accordingly, as the lengths of the optical cables 30 are reduced, it is possible to reduce the possibility that external force is applied, so it is possible to more stably connect the controller and the submodules 10.

On the other hand, in order to maintain the control board 22 of the submodule 10, it is possible to separate the front panel 18 of the display unit 17 from the power unit housing 14 and take out the control board 22 and the front panel 18 together from the power unit housing 14. By simultaneously taking out the front panel 18 and the control board 22 from the power unit housing 14, it is possible to simply maintain the control board 22.

When the control board 22 is taken out of the power unit housing 14, it is moved along guide channels 28 of support rails 26. That is, both ends of the control board 22 are guided by the guide channels 28 of the support rails 26 at both sides.

The above description is an example that explains the spirit of the present invention and may be changed and modified in various ways without departing from the basic features of the present invention by those skilled in the art. Accordingly, the embodiment described herein are provided not to limit, but to explain the spirit of the present invention and the spirit and the scope of the present invention are not limited by the embodiments. The protective range of the present disclosure should be construed on the basis of claims and all the technical spirits in the equivalent range should be construed as being included in the scope of the right of the present disclosure.

For reference, although a submodule 10 composed of the power unit 12 and the capacitor unit 13 was exemplified as a module in the embodiment shown in the figures, it may be considered to replace the power unit 12 and the capacitor unit with a first part and a second part, respectively.

Further, the submodule 10 is not necessarily divided into the power unit 12 and the capacitor unit 13, so the installation space 20 may be defined not in the power unit housing 14, but in the entire housing of the submodule 10, and the inclined surface 15 may also be formed at the front lower end of the housing of the submodule 10.

Although the cable 30 is used for signal connection between the control board 22 and the controller in this embodiment, the present invention is not limited thereto and other common cables may be used.

Further, the installation space 20 is not necessarily defined in the housing. However, the control board 22 is separated from other components by the installation space 20, so it is less influenced by the components.

The invention claimed is:

1. A modular apparatus for a high-voltage direct-current transmission system, the apparatus comprising:
a housing forming an external shape;
a display unit disposed on an inclined surface formed at a front lower portion of the housing and inclined with respect to the ground; and
a control board disposed in an installation space at a lower portion in the housing and controlling components in response to control signals transmitted from a controller located outside the housing through a cable,
wherein the display unit shows states of the components and is connected with the cable for connection with the controller, and
wherein a connector for connection with the cable is disposed at the control board.

2. The apparatus of claim 1, wherein the installation space is separated by a separation plate in a space corresponding to an inner side of the inclined surface.

3. The apparatus of claim 1, wherein a front panel is disposed on a front of the display unit at a position of an open hole and a panel hole is formed through the front panel so that an inside of the installation space is seen from outside the housing.

4. The apparatus of claim 3, wherein the front panel is coupled to the control board through a coupling block and the coupling block has a flat side where the control board is coupled and an inclined side having a predetermined inclination to couple the front panel.

5. The apparatus of claim 3, wherein lamps for showing the states of components in the module are disposed at a front end of the control board so that the states can be checked through the panel hole from outside the housing.

6. The apparatus of claim 1, wherein the connector for connection with the cable is disposed at a front end of the control board.

7. The apparatus of claim 1, wherein both ends of the control board are configured to be moved along guide channels of support rails disposed at both sides in the installation space.

8. The apparatus of claim 1, wherein the housing is a first part of the modular apparatus, and a second part of the modular apparatus is separably combined with the first part.

9. The apparatus of claim 8, wherein the first part is a power unit and the second part is a capacitor unit.

10. The apparatus of claim 1, wherein the housing is a first part of the modular apparatus, and a second part of the modular apparatus is separably combined with the first part.

11. The apparatus of claim 2, wherein the housing is a first part of the modular apparatus, and a second part of the modular apparatus is separably combined with the first part.

12. The apparatus of claim 3 wherein the housing is a first part of the modular apparatus, and a second part of the modular apparatus is separably combined with the first part.

13. The apparatus of claim 4, wherein the housing is a first part of the modular apparatus, and a second part of the modular apparatus is separably combined with the first part.

14. The apparatus of claim 5, wherein the housing is a first part of the modular apparatus, and a second part of the modular apparatus is separably combined with the first part.

15. The apparatus of claim 6, wherein the housing is a first part of the modular apparatus, and a second part of the modular apparatus is separably combined with the first part.

16. The apparatus of claim 7, wherein the housing is a first part of the modular apparatus, and a second part of the modular apparatus is separably combined with the first part.

* * * * *